(12) United States Patent
Nishioka

(10) Patent No.: US 7,800,029 B2
(45) Date of Patent: Sep. 21, 2010

(54) HEATING DEVICE

(75) Inventor: Masao Nishioka, Tokoname (JP)

(73) Assignee: NGK Insulators, Ltd., Nagoya (JP)

( * ) Notice: Subject to any disclaimer, the term of this patent is extended or adjusted under 35 U.S.C. 154(b) by 571 days.

(21) Appl. No.: 11/687,900

(22) Filed: Mar. 19, 2007

(65) Prior Publication Data

US 2007/0221662 A1  Sep. 27, 2007

(30) Foreign Application Priority Data

Mar. 24, 2006  (JP) .............................. 2006-084104

(51) Int. Cl.
  *H05B 3/44* (2006.01)
  *C23F 1/00* (2006.01)
(52) U.S. Cl. .................... 219/544; 219/444.1; 392/416; 392/418; 361/234; 156/345.51; 156/345.52; 156/345.45; 156/345.44; 118/728; 118/124; 118/125
(58) Field of Classification Search ............... 219/544, 219/444.1; 392/416, 418; 361/234; 156/345.51, 156/345.52, 345.45, 345.44; 118/723 V, 118/124–125, 728, 500
See application file for complete search history.

(56) References Cited

U.S. PATENT DOCUMENTS

| 6,020,076 A | 2/2000 | Fujii et al. |
| 6,645,304 B2 | 11/2003 | Yamaguchi |

FOREIGN PATENT DOCUMENTS

| JP | 02-277173 | * 10/1996 |
| JP | 08-277173 A1 | 10/1996 |
| JP | 2002-134590 A1 | 5/2002 |

* cited by examiner

*Primary Examiner*—Shawntina Fuqua
(74) *Attorney, Agent, or Firm*—Burr & Brown

(57) ABSTRACT

A heating device includes a high-frequency electrode embedded substantially in parallel with a heating surface of a ceramics base in the vicinity of the heating surface. A conducting hole toward this high-frequency electrode is formed in a back face of the ceramics base. This high-frequency electrode has a trapezoidal cone-like concave section toward the conducting hole at a region opposed to the conducting hole.

8 Claims, 3 Drawing Sheets

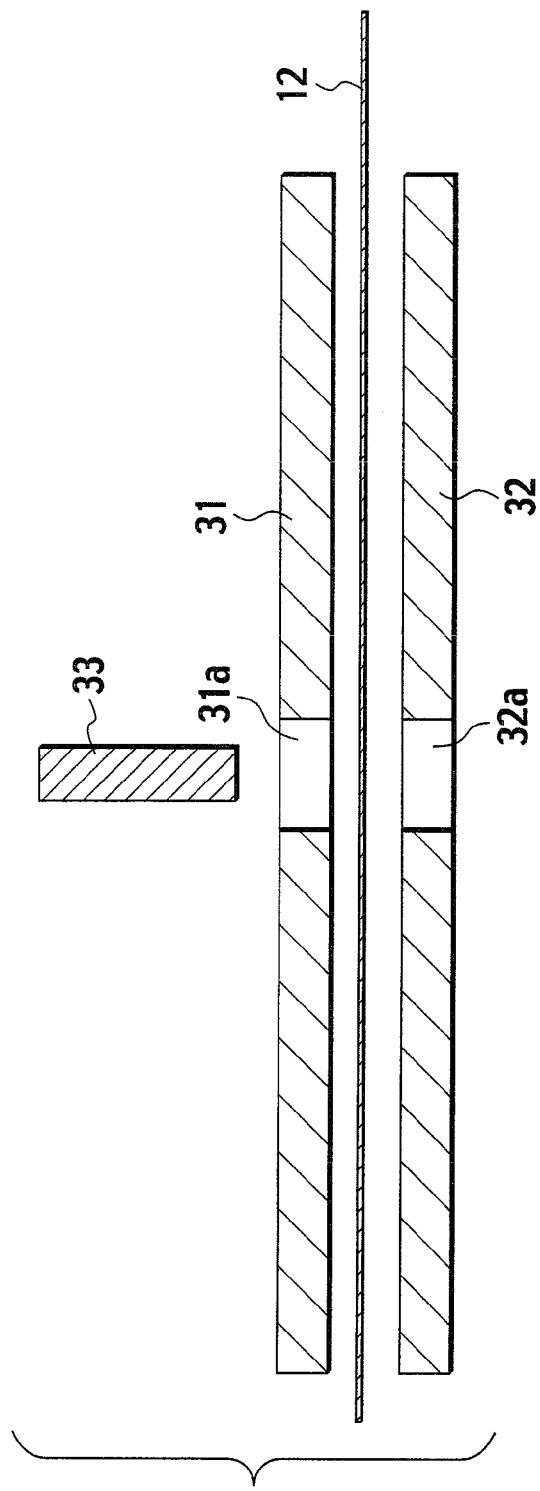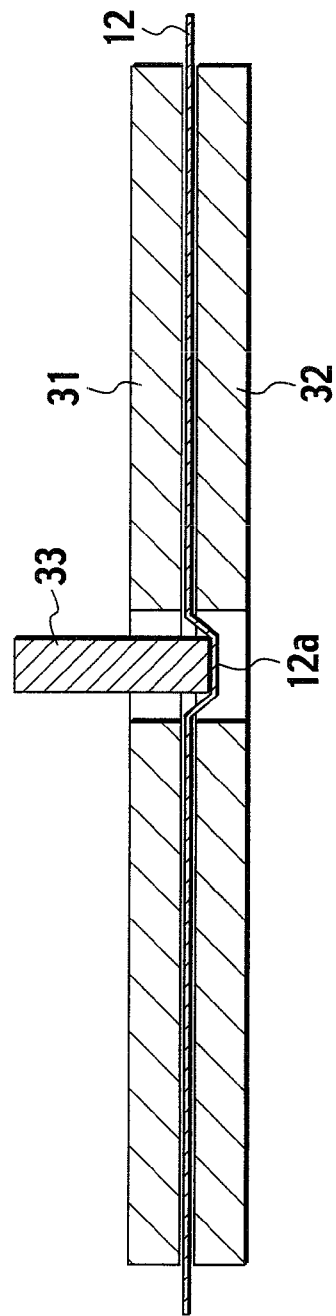
FIG. 5A
FIG. 5B

HEATING DEVICE

CROSS-REFERENCE TO RELATED APPLICATION

This application is based upon and claims the benefit of priority from Patent Application No. 2006-84104 filed on Mar. 24, 2006, in the Japanese Patent Office, of which the contents are incorporated herein by reference.

BACKGROUND OF THE INVENTION

1. Field of the Invention

The present invention relates to a heating device.

2. Description of Related Art

In a step for manufacturing a semiconductor device, a wafer is heated for forming an oxide film on the wafer by a semiconductor manufacture apparatus. One of heating devices in this semiconductor manufacture apparatus for heating a wafer is structured so that a resistance heating element is embedded in a disk-like ceramics base on which a wafer as a to-be-heated object is placed and is heated. This heating device is advantageously adapted not only to a film formation apparatus used for a semiconductor manufacture process but also to a surface processing apparatus such as a dry etching apparatus for etching the surface of a wafer.

When a to-be-processed object is heated by a heating device, the neighborhood of the to-be-processed object set on a heating surface of a ceramics base may be provided to have plasma atmosphere as in a film formation processing by plasma CVD or a plasma etching processing. One heating device is structured so that a high-frequency electrode for causing this plasma atmosphere is provided in the vicinity of a heating surface of a ceramics base so that the electrode is substantially in parallel with the heating surface. In the heating device as described above, a back face opposite to the heating surface of the ceramics base includes a hole for supplying power to this high-frequency electrode provided so as to face the high-frequency electrode. Power from outside is supplied to the heating device through power feeding material that is inserted to the hole so that the power feeding material is connected to the high-frequency electrode itself exposed at the bottom of the hole or a conductive member fixed to the high-frequency electrode.

With regards to the heating device as described above, a heating device has been disclosed in which a mesh-like high frequency electrode is embedded in ceramics base material of aluminum nitride and a high-frequency electrode exposed at a hole of this ceramics base material is joined to a Ni-made rod as a power feeding material by brazing material via terminals (Japanese Patent Unexamined Publication No. H08-277173).

Another heating device has been disclosed in which a Mo-made high frequency electrode having a mesh-like shape and a Ni-made rod sandwich kovar that has a thermal expansion coefficient in the middle of thermal expansion coefficients of these members and the Mo, kovar, and Ni members are joined by brazing material. Still another heating device has been disclosed in which a Mo-made high frequency electrode having a mesh-like shape is not directly joined to kovar material but the Mo-made high frequency electrode having a mesh-like shape is sintered together with a Mo bulk material having a diameter of 3 mm and a thickness of 2 mm to join this Mo bulk material with kovar material (Japanese Patent Unexamined Publication No. 2002-134590).

A mesh for this high-frequency electrode is a sheet obtained by knitting a thin metal wire and is mainly made of Mo. A high-frequency electrode using this mesh is shaped to have a flat surface embedded in parallel with a ceramics base heating surface in order to uniformize the distribution of plasma over a to-be-heated object. Thus, a mesh-like high frequency electrode that is at a part opposed to a hole formed in the ceramics base and that is joined by a terminal by gold solder also has a flat surface. A region between the mesh-like high frequency electrode in the ceramics base and the heating surface of the ceramics base is made of ceramics material such as aluminum nitride and functions as a dielectric material layer and has a thickness of about 1 mm in order to provide a uniform plasma distribution. A wafer is placed on a surface at this dielectric material layer (i.e., a heating surface).

The above-described structure of a high-frequency electrode is commonly used for a heater, an electrostatic chuck, and a susceptor.

An aluminum nitride-made ceramics base in which a mesh-like high frequency electrode is embedded has a thickness of about 5 to 25 mm. This thickness includes a thickness of about 1 mm of the aluminum nitride layer as the dielectric material layer between a high-frequency electrode and a heating surface as described above. A ceramics base is structured so that the dielectric material layer at a part opposed to the hole inserted with a power feeding material is weakest and has a low strength.

This has caused a risk where this thin dielectric material layer or an insulating material layer may have a crack when a region as a dielectric material layer between this high-frequency electrode and the heating surface that is opposed to the hole inserted with the power feeding material is subjected to a thrust for inserting the Ni rod made of this power feeding material to the hole or when this Ni rod is expands or contracts.

This will be described in detail. The Ni rod is attached to the ceramics base by inserting a connector formed at the tip end of the Ni rod to the hole of the ceramics base. Thus, the thrust force applied to the Ni rod and the connector is transmitted to a soldered section as a terminal of the high-frequency electrode to push up the thin dielectric material layer. This has caused a risk where this thrust may cause a crack. Furthermore, when the connector formed at the tip end of the Ni rod is joined and fixed to a joint section in the high-frequency electrode (i.e., the terminal section of the high-frequency electrode), the Ni rod repeats thermal expansion and contraction in accordance with a temperature increase and cooling of the ceramics base. This applies a cyclic stress to the thin dielectric material layer. This repeated stress also causes a risk of a crack.

The heating surface at the dielectric material layer of the ceramics base is exposed to highly-corrosive gas atmosphere including high-frequency plasma or fluorine when a to-be-heated object is processed. Thus, the condition of the heating surface gradually deteriorates after the use for a long period of time. This gradual deterioration causes increased cracks even when a load that is caused by the above-described thrust or repeated stress and that is applied to the thin dielectric material layer is fixed. This has caused a risk of a shorter life after the use for a long period of time. Furthermore, a space that has a contact with the upper side of the terminal section of the high-frequency electrode (dielectric material layer-side) in the ceramics base generally has a negative pressure that is a pressure in a chamber in which a to-be-heated object is heated, and a space having a contact with the Ni rod-side region is frequently blocked from the interior of the chamber to have an atmosphere pressure. The difference of these pressures has encouraged the generation and growth of the crack in the dielectric material layer.

Once such a crack is caused, the crack grows due to the presence of the above described pressure difference, plasma or corrosive environment, and the grown crack penetrates the dielectric material layer, causing the heater, the electrostatic chuck, or the susceptor to be nonusable.

In view of the above, it is an objective of the present invention to provide a heating device that advantageously suppresses the crack caused in the vicinity of the terminal section of the high-frequency electrode to provide a high reliability and a long life.

SUMMARY OF THE INVENTION

In order to achieve the above objective, the heating device of the present invention is characterized in including: a high-frequency electrode that is disposed in a ceramics base having a heating surface for heating a to-be-heated object and that is provided substantially in parallel with the heating surface in which a conducting hole toward this high-frequency electrode is provided at a back face of the ceramics base. The high-frequency electrode has a trapezoidal cone-like concave section toward the conducting hole at a region opposed to the conducting hole.

According to the heating device of the present invention, a highly-reliable heating device can be obtained that is difficultly damaged even when subjected to a thrust for attaching or detaching a power feeding material or a repeated stress due to the use for a long period of time.

BRIEF DESCRIPTION OF THE DRAWINGS

The above and further objects, features and advantages of the invention will more fully appear in the detailed description of embodiments of the invention, when the same is read in conjunction with the drawings, in which:

FIG. 5A is a cross-sectional view illustrating a press working of a high-frequency electrode;

FIG. 5B is a cross-sectional view illustrating a press working of a high-frequency electrode.

DETAILED DESCRIPTION OF THE INVENTION

Hereinafter, illustrative embodiments of the heating device of the present invention will be described with reference to the drawings.

Figure 1:
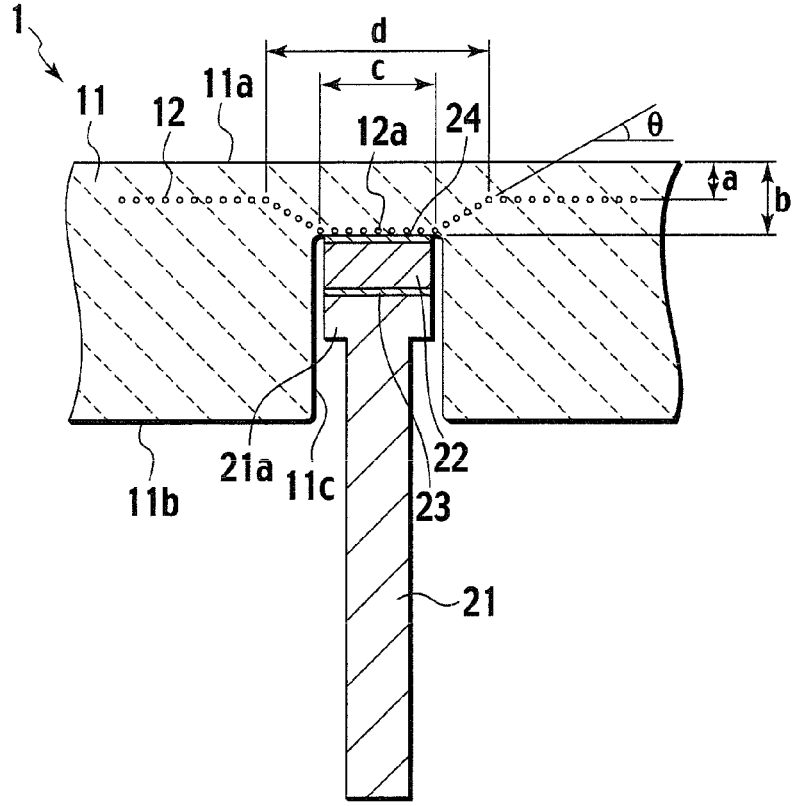
FIG. 1 is a cross-sectional view illustrating the main part of a heating device according to one illustrative embodiment of the present invention.

FIG. 1 is a cross-sectional view illustrating the main part of a heating device according to one illustrative embodiment of the present invention. A heating device 1 shown in FIG. 1 has a disk-like ceramics base 11. This ceramics base 11 is made of insulating ceramics (e.g., aluminum nitride, alumina) and one surface is a heating surface 11a on which a to-be-heated object is set and heated. A back face 11b is provided at an opposite side of this heating surface 11a and has therein a conducting hole 11c leading to the heating surface 11a.

A heating means for heating a to-be-heated object set on the heating surface 11a may be, for example, a resistance heating element embedded in the ceramics base 11 or a sheet-like heating element abutted with the back face 11b of the ceramics base 11. Thus, the heating means is not particularly shown in FIG. 1.

A mesh-like high frequency electrode 12 is embedded in this ceramics base 11 substantially in parallel with the heating surface 11a to have a predetermined distance from the heating surface 11a (distance shown by the reference numeral "a" in FIG. 1). This high-frequency electrode 12 has a trapezoidal cone-like concave section 12a to this conducting hole 11c at a position opposed to the conducting hole 11c of the ceramics base 11. This high-frequency electrode 12 has a concave section 12a whose bottom section is exposed to the surface of the conducting hole 11.

The high-frequency electrode 12 exposed in the conducting hole 11c of the ceramics base 11 is supplied with power from a power feeding material 21. The power feeding material 21 is a Ni-made bar-like member having an oxidation resistance for example and one tip end thereof has a connector section 21a inserted to the conducting hole 11c and the other tip end thereof is connected to a high-frequency power source via an electric connection member (not shown). The electric connection member is generally fixed to a chamber for storing the ceramics base 11. Thus, the high-frequency power source-side tip end of the power feeding material 21 is physically fixed. The tip end of the connector section 21a of this power feeding material 21 has a stress relaxation material 22 that has a thermal expansion coefficient in the middle of the thermal expansion coefficient of ceramics constituting the ceramics base 11 and the thermal expansion coefficient of Ni constituting the power feeding material 21 and that is conductive and that is soldered by this connector section 21a and gold brazing material 23 for example. A tip end face of this stress relaxation material 22 is soldered to a bottom face of the concave section 12a of the high-frequency electrode 12 exposed in the conducting hole 11c by the gold brazing material 23 for example and is electrically connected.

In the heating device 1 of this illustrative embodiment shown in FIG. 1, the high-frequency electrode 12 has the trapezoidal cone-like concave section 12a, at a region opposed to the conducting hole 11c, that faces the conducting hole 11c as described above. Thus, in the region opposed to this conducting hole 11c, a distance between the bottom face of the concave section of the high-frequency electrode 12 and the heating surface 11a (the reference numeral "b" shown in FIG. 1) does not have a trapezoidal cone-like shape in proportion with the depth of the concave section of this trapezoidal cone-like shape and is thicker than the region having a flat surface-like shape. Thus, the region as a dielectric material layer or an insulating material layer between the high-frequency electrode 12 and the heating surface 11a can have an increased strength and thus can suppress a crack from being generated.

The high-frequency electrode 12 only has to have a trapezoidal cone-like shape at a part at which the conducting hole 11c is formed seen as from the heating surface 11a of the ceramics base 11. Thus, this high-frequency electrode 12 does not have any adverse affects on the distribution of plasma density generated on the heating surface 11a of the ceramics base 11.

By the structure as described above, the heating device of this illustrative embodiment can be a heating device that is difficultly damaged by a thrust for attaching the power feeding material 21 or repeated stress by the use for a long period of time and that can maintain high reliability for a long period of time.

The concave section 12a of the high-frequency electrode 12 has a trapezoidal cone-like shape. The trapezoidal cone-like shape allows a load applied from the power feeding material 21 to be uniformly transmitted from this concave section to the heating surface 11a-side dielectric material layer or insulating material layer. This can stably provide an improved strength and also can provide the concave section 12a with a shape symmetrical to a straight line vertical to the heating surface 11a. This prevents uneven distribution of generated plasma. Furthermore, the concave section having a trapezoidal cone-like shape allows, when the heating device 1 is manufactured, a weak compression stress to be left at an aluminum nitride part at the inner side of this trapezoidal cone for example due to a difference in a thermal expansion coefficient between metal material constituting the high-frequency electrode (e.g., Mo) and ceramics material at the inner side of this trapezoidal cone (e.g., aluminum nitride). This compression stress has a function to reduce a tensile stress applied to the heating surface 11a of the ceramics base 11 due to cooling and heating operation during the use of the heating device 1. This provides a structure in which deterioration in the strength is suppressed even when the structure is subjected to a repeated thermal cycle. The trapezoidal cone-like shape can be easily prepared by subjecting a high-frequency electrode having a flat surface to a press working.

The high-frequency electrode 12 having the concave section 12a more preferably has a structure in which a part other than this concave section 12a has a distance "a" to the heating surface 11a of 1.2 mm or less. When this distance "a" exceeds 1.2 mm, an adverse affect may be caused on the density of plasma caused by this high-frequency electrode 12. One of advantageous effects of the heating device of this illustrative embodiment is that, when this distance "a" is 1.2 mm or less, this distance "a" is not required to be longer than that of a conventional case and a crack can be prevented from being generated while securing uniform plasma.

The trapezoidal cone-like shape of the concave section 12a of the high-frequency electrode 12 is more preferably structured so that a bottom face of a trapezoidal cone-like concave section has a diameter (the reference numeral "c" of FIG. 1) of 3 mm or more and 5 mm or less, the depth of the concave section (a difference between the distance "b" and the distance "a" of FIG. 1) is 1 mm or more and 3 mm or less, the concave section has the maximum diameter (the reference numeral "d" of FIG. 1) of 7 mm or less, and the inclination angle of the side wall of the concave section (the reference numeral θ of FIG. 1) is larger than 30° and satisfies 75°. When these numeric ranges are satisfied, a particularly sufficient strength can be obtained. The diameter of the bottom face of the trapezoidal cone-like concave section (the reference numeral "c" of FIG. 1) of 3 mm or more and 5 mm or less in particular can secure a sufficient brazing area. Thus, an effect is obtained according to which the tensile strength of a brazing joint section is prevented from being reduced, which is preferable. Furthermore, the inclination angle of the side wall of the concave section (the reference numeral θ of FIG. 1) larger than 30° and satisfying 75° can disperse in a circular manner the thrust applied to the high-frequency electrode for example so that a dielectric material layer or an insulating material layer in a wide region as seen from the heating surface 11a can support the load such as thrust.

Figure 2:
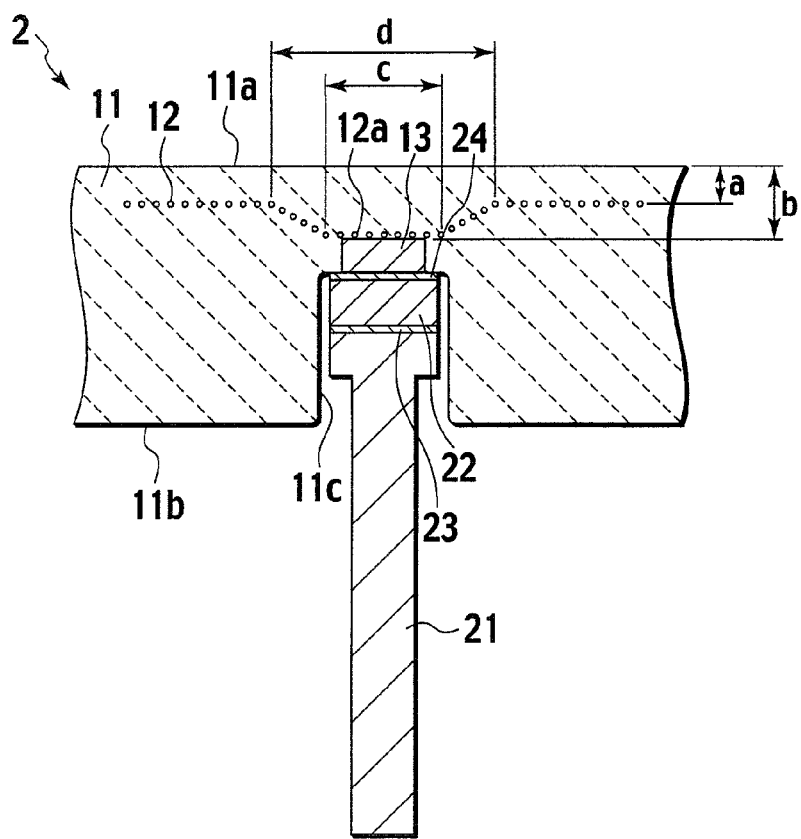
FIG. 2 is a cross-sectional view illustrating the main part of a heating device according to another illustrative embodiment of the present invention.

Next, FIG. 2 is a cross-sectional view illustrating the main part of another illustrative embodiment of the present invention. It is noted that the same members in FIG. 2 as those of FIG. 1 are denoted with the same reference numerals and thus will not be described further.

A heating device 2 shown in FIG. 2 is the same as the heating device 1 shown in FIG. 1 in which the mesh-like high frequency electrode 12 embedded in the ceramics base 11 has the trapezoidal cone-like concave section 12a to this conducting hole 11c at a position of the ceramics base 11 opposed to the conducting hole 11c. The bottom section of this trapezoidal cone-like concave section 12a is connected to a conductive member 13 embedded between this trapezoidal cone-like concave section 12a and the bottom face of the conducting hole 11c of the ceramics base 11. This conductive member 13 is made of the same sintered Mo metal as that of the high-frequency electrode 12. A surface of this conductive member 13 opposed to this conducting hole 11c is exposed in this penetration hole 11a and this surface is fixedly brazed to the stress relaxation material 22 at the tip end of the power feeding material 21 by gold brazing material 24.

The illustrative embodiment shown in FIG. 2 provides the same effect as that by the illustrative embodiment shown in FIG. 1. Thus, the region as the insulating material layer between this high-frequency electrode 12 and the heating surface 11a can have an increased strength, thus suppressing the generation of a crack. Furthermore, the high-frequency electrode 12 does not have any adverse affects on the distribution of densities of plasma generated on the heating surface 11a of the ceramics base 11.

The illustrative embodiment shown in FIG. 2 also provides the concave section 12a of the high-frequency electrode 12 with a trapezoidal cone-like shape. Thus, the same effect as that described in the illustrative embodiment shown in FIG. 1 can be obtained. Furthermore, a more preferable numeric range of the trapezoidal cone-like shape of the concave section 12a of the high-frequency electrode 12 shown in FIG. 2 is the same numeric range as that described in the illustrative embodiment shown in FIG. 1.

Figure 3:
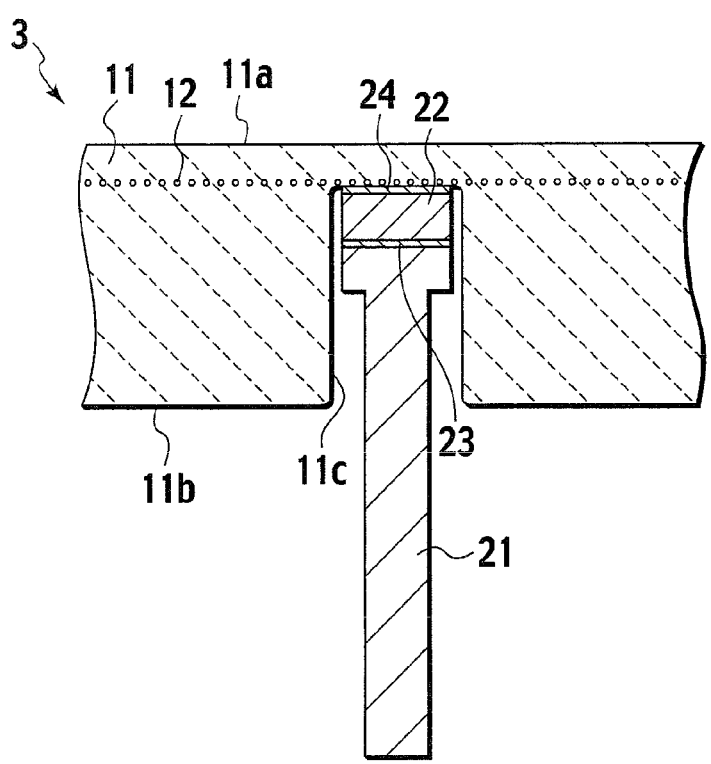
FIG. 3 is a cross-sectional view illustrating the main part of a conventional heating device.
Figure 4:
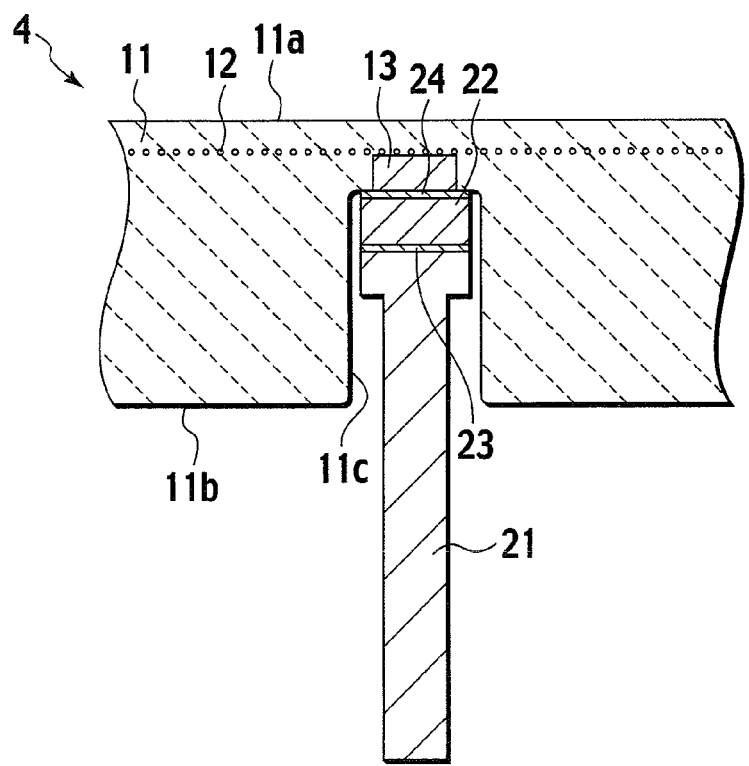
FIG. 4 is a cross-sectional view illustrating the main part of a conventional heating device.

Next, FIG. 3 and FIG. 4 are a cross-sectional view illustrating the main part of a conventional heating device as a comparative example. In FIG. 3 and FIG. 4, the same members as those of FIG. 1 and FIG. 2 are denoted with the same reference numerals and will not be described further.

A heating device 3 shown in FIG. 3 is a comparative example corresponding to the heating device 1 shown in FIG. 1. In the heating device 3, the high-frequency electrode 12 does not have the trapezoidal cone-like concave section shown in FIG. 1 at a region opposed to the conducting hole 11c. Thus, a distance between the high-frequency electrode 12 and the heating surface 11a in this region is smaller than that of the heating device 1 shown in FIG. 1.

A heating device 4 shown in FIG. 4 is a comparative example corresponding to the heating device 2 shown in FIG. 2. In the heating device 4, the high-frequency electrode 12 does not have the trapezoidal cone-like concave section shown in FIG. 2 at a region opposed to the conducting hole 11c and the conductive member 13. Thus, a distance between the high-frequency electrode 12 and the heating surface 11a in this region is smaller than that of the heating device 2 shown in FIG. 2.

In the heating devices 1 and 2 of the present invention shown in FIG. 1 and FIG. 2, the ceramics base material 11 may include aluminum nitride or alumina as a main component.

The high-frequency electrode 12 is preferably made of a high melting point metal because the material of the high-frequency electrode 12 is simultaneously sintered together with ceramics powders (e.g., aluminum nitride powders, alumina powders) as raw material of the ceramics base 11 during the manufacture. The high-frequency electrode 12 may be made of high melting point metal such as tantalum, tungsten, molybdenum, platinum, rhenium, hafnium, niobium and alloy thereof. When the ceramics base 11 is made of aluminum nitride, molybdenum is the most preferable. When the ceramics base 11 is made of alumina, niobium, tungsten, or platinum is the most preferable.

The high-frequency electrode 12 is preferably made of a planar metal bulk member obtained by forming an integrated planar metal member. The planar bulk material as described above includes, for example, the one consisting of a thin plate or the one consisting of a woven metal wire (mesh). The high melting point metal used for the high-frequency electrode 12 is difficultly machined. Thus, a woven metal wire (mesh) obtained by knitting a wire of a high melting point metal is more preferable than the one made of a thin plate. When the high-frequency electrode 12 is made of a woven metal wire, the concave section 12a can be more easily formed by a press working than in the case where the high-frequency electrode 12 is made of a thin plate, which is advantageous.

The woven metal wire as described above is not limited to a particular mesh shape or a wire diameter. However, a range from a wire diameter φ of 0.03 mm and 150 mesh to a wire diameter φ of 0.5 mm and 6 mesh could be used without causing a particular problem. Furthermore, a wire rod constituting a woven metal wire may have a cross section in the width direction having various rolled shapes such as a circle shape, a elliptic shape, or a rectangular shape. The term "1 mesh" herein means one wire per one inch.

The concave section 12a of the high-frequency electrode 12 can be formed by press working. FIG. 5A and FIG. 5B are a cross-sectional view illustrating this press working. As shown in FIG. 5A, a working apparatus used for this press working has an upper pattern 31, a lower pattern 32, and a punch 33. The upper pattern 31 and the lower pattern 32 have penetration holes 31a and 32a having a predetermined hole diameter through which the punch 33 can be inserted, respectively. First, this working apparatus is used to sandwich the material of the high-frequency electrode 12 between the upper pattern 31 and the lower pattern 32. Next, as shown in FIG. 5B, the punch 33 is pushed through the penetration hole 31a of the upper pattern 31 toward the high-frequency electrode 12. The steps as described above can provide the high-frequency electrode 12 having the trapezoidal cone-like concave section 12a.

Next, a method for manufacturing the heating device 1 according to an illustrative embodiment of the present invention will be described. The heating device 1 is structured so that the high-frequency electrode 12 in the ceramics base 11 has the trapezoidal cone-like concave section 12a. Thus, when the ceramics base 11 is manufactured by a uniaxial pressing, a compact for a part corresponding to the lower part of the high-frequency electrode 12 of the ceramics base 11 is firstly prepared by pressurizing ceramics powders. When this compact is prepared, a part corresponding to the trapezoidal cone-like concave section 12a of the high-frequency electrode 12 is formed to have a concave section having the same shape as that of this concave section 12a. The concave section of this compact is formed by using a metal mold having a convex section having a shape engaged with the trapezoidal cone-like concave section 12a of the high-frequency electrode 12 as an upper pattern to press the compact to form the concave section 12a or by placing an alumina-made bulk component corresponding to the concave section 12a at a part corresponding to the concave section 12a to press the component to have a flat surface.

Next, the compact including this concave section has thereon the high-frequency electrode 12 and the concave section of the compact has thereon the concave section 12a of the high-frequency electrode 12. Then, ceramics powders are placed on this high-frequency electrode 12 in the metal mold to sufficiently fill ceramics powders in the concave section 12a of the high-frequency electrode 12. Then, the powders are pressed by the upper pattern having a flat surface, thereby providing a final compact for the ceramics base 11.

Steps for manufacturing the heating device of the present invention other than the above steps are the same as those of conventionally-known steps.

EXAMPLES

The heating devices as shown in FIG. 1 and FIG. 2 were prepared. First, a ceramics base was prepared in the manner as described below. First, AlN powders obtained by the reduction-nitridation method were added with 5% of $Y_2O_3$ to provide ceramics mixed powders. Then, the ceramics mixed powders were added with acrylic resin binder to prepare granulated powders by the spraying granulation method. The granulated powders were filled in a metal mold and were pressed to prepare a preparatory compact. Then, a transfer pattern was used to form a groove at a position at which a resistance heating element is embedded. Then, the groove includes therein a linear Mo resistance heating element that is provided as a wound body having a diameter of 0.5 mm. Then, ceramics raw material powders are filled in this grooved. Then, an alumina-made bulk component having the same shape as that of the inner side of this concave section was placed at a part corresponding to the concave section of the high-frequency electrode and was pressed. Then, the high-frequency electrode was placed and ceramics raw material powders were filled on the high-frequency electrode and then the entirety was pressed in one axial direction again with a pressing pressure of 200 kg/cm². In this manner, a compact of a ceramics base in which the resistance heating element and the electrostatic chuck electrode were embedded was prepared.

Then, the compact was taken out and was sintered in a hot press firing furnace based on sintering conditions of a nitrogen gauge pressure was 0.5 kg/cm² and a temperature of 1860 degrees for 6 hours. The resultant sintered body had an outer diameter of about 330 mm and a thickness of about 17 mm. The resistance heating element was embedded at a depth of 8.5 mm from the heating surface.

A hole for a lift pin and purge gas was formed in the resultant sintered body. A diamond abrasive paper and a grind stone were used to use a rotary flat grinding machine to provide a flat surface to the surface of the ceramics base as a heating surface. Then, the back face of the sintered body was subjected to machining by a machining center to form a conducting hole in which the high-frequency electrode is exposed.

Then, a shaft for supporting the ceramics base was prepared based on the following conditions. AlN powders obtained by the reduction-nitridation method were added with 5% of $Y_2O_3$ to provide ceramics mixed powders. Then, the ceramics mixed powders were added with acrylic resin binder to prepare granulated powders by the spraying granulation method. Then, the granulated powders were used to prepare a compact by the CIP method.

Next, a shaft compact was sintered in nitrogen atmosphere with conditions of a sintering temperature of 1850 degrees for 3 continuous hours. The resultant shaft after the sintering showed a joint section having an outer diameter of 70 mm, an intermediate part of the shaft axis had an outer diameter φ of 37 mm, and the shaft had a thickness of 4.0 mm and a length of 180 mm.

The shaft surface and the joint surface with the base were wrapped. The respective joint surfaces with the ceramics base and the shaft were coated by yttrium nitrate water solution having a yttrium concentration of $2.6 \times 10^{-6}$ mol/cc. Then, the former and the latter were adhered and the resultant structure was heat-processed in nitrogen atmosphere with a temperature of 1800 degrees for 2 hours. Thus, the shaft was joined to the center of the back face of the base.

After the joint, the respective terminals of the resistance heating element embedded in the ceramics base and the electrostatic chuck electrode were joined with an Ni-made power supply rod by brazing, thereby providing a completed heating device.

The joint by brazing was performed by the manner as described below. A gold foil (diameter φ of 2.5 mm, thickness of 0.1 mm) and an Au-18% Ni foil (diameter φ of 2.5 mm, thickness of 0.1 mm) were placed on the high-frequency electrode exposed in the conducting hole Then, the metal foil has thereon a kovar plate as a stress relaxation material having a diameter φ of 4.0 mm and a thickness of 3.0 mm. The stress relaxation material has thereon an Au-18 wt % Ni alloy foil (diameter φ of 3.5 mm, thickness of 0.1 mm) and a nickel-made rod-like power feeding material was placed on the foil.

The assembly obtained as described above was heated at a temperature of 1000 degrees for 10 minutes in vacuum atmosphere while the assembly being applied with a load of 500 g. Thus, a joint structure shown in FIG. 1 was manufactured.

Furthermore, the heating device as shown in FIG. 2 in which a Mo bulk body as a conducting member was embedded was also prepared. The Mo bulk body had a diameter φ of 3 mm and a height of 2 mm. The Mo bulk body was embedded by the method as described below. When a lower compact at which a part corresponding to the concave section of the high-frequency electrode was formed was prepared, a part corresponding to this conductive member was provided to have a space and the compact was prepared. This Mo bulk body was previously fixed at the bottom face of the concave section of the Mo-made mesh-like high frequency electrode by glue. When the Mo mesh was placed on the powder compact, the Mo bulk was simultaneously embedded.

With regards to the respective resultant heating devices, a heater was placed in a tensile tester so as to apply a load vertical to this Ni rod and the load from the joint side to the dielectric material layer side was gradually increased with an increase rate of 20 kg/min. Then, a load at which a crack was caused in the insulating material layer (breaking load in the table) was measured.

The prepared heater was placed in a CVD chamber and was heated at 500 degrees. The Ni rod was applied with a high-frequency voltage of 13.56 MHz and 500 W to generate plasma between the high-frequency electrode and the upper electrode in the chamber. Then, $SiH_4$ gas and mixture gas of nitrogen and oxygen were introduced to form an Si—O—N film on the Si wafer placed on the heater. The surface of the wafer corresponding to a circle of φ 50 mm around the joint of the high-frequency electrode and the Ni rod was measured by a surface profile optical film thickness meter by light passing the center in four straight line directions to measure the distribution of the thicknesses of the resultant Si—O—N film. This distribution of the thicknesses of the films was obtained by dividing a difference between the maximum value and the minimum value at 15 points by an average thickness. When uniform plasma is generated, a film thickness distribution will be small. Then, a film formation rate was also measured based on the average thickness and the film formation time. Furthermore, with regards to some heaters, the Ni rods were pulled by an autograph to measure a strength (tensile strength) at which a brazed section was peeled and damaged.

The results are shown in Tables 1 and 2. Table 1 shows examples of the heating device shown in FIG. 1. Table 2 shows examples of the heating device shown in FIG. 2. In Tables 1 and 2, "a", "b", "c", and "d" show the sizes of the respective parts shown in FIG. 1 and FIG. 2. The film formation rates in the respective examples in Tables 1 and 2 are relative values based on an assumption that values of Example 1 are 100.

TABLE 1

|  | a [mm] | b [mm] | c [mm] | d [mm] | θ | Breaking load [kg] | Film thickness distribution | Film formation rate | Tensile strength [kg] |
| --- | --- | --- | --- | --- | --- | --- | --- | --- | --- |
| Example 1 | 1 | 2 | 3 | 5 | 45.0 | 55 | 0.4% | 100 | 54 |
| Example 2 | 1 | 2.5 | 3 | 5 | 56.3 | 62 | 0.5% | 99 | 56 |
| Example 3 | 1 | 3 | 3 | 5 | 63.4 | 73 | 0.5% | 100 | 55 |
| Example 4 | 1 | 2 | 4 | 6 | 45.0 | 57 | 0.5% | 100 | — |
| Example 5 | 1 | 2.5 | 4 | 6 | 56.3 | 64 | 0.4% | 99 | — |
| Example 6 | 1 | 3 | 4 | 6 | 63.4 | 73 | 0.5% | 100 | — |
| Example 7 | 1 | 2 | 5 | 7 | 45.0 | 56 | 0.5% | 100 | — |
| Example 8 | 1 | 2.5 | 5 | 7 | 56.3 | 65 | 0.4% | 99 | — |
| Example 9 | 1 | 3 | 5 | 7 | 63.4 | 74 | 0.5% | 100 | — |
| Example 10 | 1 | 2 | 3 | 6 | 33.7 | 55 | 0.5% | 100 | — |
| Example 11 | 1.2 | 3 | 5 | 7 | 60.9 | 75 | 0.5% | 94 | — |
| Example 12 | 0.8 | 3 | 5 | 7 | 65.6 | 68 | 0.5% | 100 | — |
| Example 13 | 0.6 | 3 | 5 | 7 | 67.4 | 62 | 0.5% | 100 | — |
| Example 14 | 1 | 4 | 5 | 7 | 71.6 | 55 | 0.5% | 100 | — |
| Example 15 | 1 | 2 | 3 | 4 | 63.4 | 53 | 0.4% | 100 | — |
| Comparative Example 1 | 1 | — | — | — | 0.0 | 22 | 0.5% | 99 | — |
| Comparative Example 2 | 1 | 1.5 | 3 | 5 | 26.6 | 26 | 0.4% | 100 | 54 |
| Comparative Example 3 | 1 | 2 | 6 | 8 | 45.0 | 54 | 1.2% | 100 | — |
| Comparative Example 4 | 1 | 3 | 4 | 5 | 76.0 | 28 | 1.0% | 99 | — |
| Comparative Example 5 | 1 | 2 | 3 | 8 | 21.8 | 55 | 1.5% | 100 | — |
| Comparative Example 6 | 1.5 | 3 | 5 | 7 | 56.3 | 80 | 0.5% | 72 | — |
| Comparative Example 7 | 2 | 3 | 5 | 7 | 45.0 | 90 | 0.7% | 46 | — |
| Comparative Example 8 | 1 | 5 | 5 | 7 | 76.0 | 55 | 1.0% | 100 | — |
| Comparative Example 9 | 1 | 2 | 2 | 5 | 33.7 | 55 | 0.4% | 100 | 17 |

TABLE 1-continued

|  | a [mm] | b [mm] | c [mm] | d [mm] | θ | Breaking load [kg] | Film thickness distribution | Film formation rate | Tensile strength [kg] |
|---|---|---|---|---|---|---|---|---|---|
| Comparative Example 10 | 1 | 2 | 3 | 3.5 | 76.0 | 32 | 0.5% | 100 | — |
| Comparative Example 11 | 1 | 2 | 4 | 4.1 | 87.1 | 27 | 0.5% | 100 | — |

TABLE 2

|  | a [mm] | b [mm] | c [mm] | d [mm] | θ | Breaking load [kg] | Film thickness distribution |
|---|---|---|---|---|---|---|---|
| Example 16 | 1 | 2 | 3 | 5 | 45.0 | 59 | 0.5% |
| Example 17 | 1 | 2.5 | 3 | 5 | 56.3 | 68 | 0.4% |
| Example 18 | 1 | 3 | 3 | 5 | 63.4 | 77 | 0.5% |
| Example 19 | 1 | 2 | 4 | 6 | 45.0 | 60 | 0.5% |
| Example 20 | 1 | 2.5 | 4 | 6 | 56.3 | 69 | 0.5% |
| Example 21 | 1 | 3 | 4 | 6 | 63.4 | 78 | 0.4% |
| Example 22 | 1 | 2 | 5 | 7 | 45.0 | 58 | 0.5% |
| Example 23 | 1 | 2.5 | 5 | 7 | 56.3 | 69 | 0.5% |
| Example 24 | 1 | 3 | 5 | 7 | 63.4 | 76 | 0.4% |
| Example 25 | 1 | 2 | 3 | 6 | 33.7 | 61 | 0.5% |
| Comparative Example 12 | 1 | — | — | — | 0.0 | 24 | 0.5% |
| Comparative Example 13 | 1 | 2 | 6 | 8 | 45.0 | 68 | 1.1% |
| Comparative Example 14 | 1 | 3 | 4 | 5 | 76.0 | 28 | 1.2% |
| Comparative Example 15 | 1 | 2 | 3 | 8 | 21.8 | 55 | 1.4% |

As can be seen from Tables 1 and 2, when Examples 1 to 15 of Table 1 and Examples 16 to 25 of Table 2 of the present invention are compared with a Comparative Example 1 according to a conventional heating device shown in FIG. 3 and Comparative Example 12 according to a heating device shown in FIG. 4, the mesh-like high frequency electrode at the terminal joint has a concave section and the dielectric material layer at the terminal joint has an increased thickness. Thus, an increased strength proportional to the terminal section can be obtained without damaging the plasma distribution.

Furthermore, Examples 1 to 15 of Table 1 and Examples 16 to 25 of Table 2 were structured so that the dielectric material layer had the thickness "a" of 1.2 mm or less, the concave section had the bottom face diameter "c" of 3 mm to 5 mm, the depth of the concave section ("b" to "a") was 1 mm or more and 3 mm or less, the concave section had the maximum diameter "d" of 7 mm or less, and the concave side wall had an angle θ higher than 30° and lower than 75°. This can secure a practically-sufficient strength and uniform plasma.

As can be seen by the comparison between Example 1 and Comparative Example 9 of Table 1 and the comparison between Example 16 and Comparative Example 13 of Table 2, the bottom face diameter of the concave section of 3 mm or more can secure a sufficient brazing area and thus a reduced tensile strength is prevented, which is preferable.

When Examples 1 to 15 have the thickness of the dielectric material layer of 1.2 mm or less as a comparison with Comparative Example 12 and Comparative Example 13, an improved terminal section strength can be obtained while securing uniform plasma and preventing a film formation rate from being reduced, which is preferable.

In Examples 1 to 15 of Table 1 and Examples 16 to 25 of Table 2, the trapezoidal cone-like concave section allows a load applied to the Ni rod to be uniformly applied to the dielectric material layer. This can not only provide an improved strength but also provide symmetry. Thus, non-uniform plasma is prevented. Furthermore, the angle of the side wall of the concave section higher than 30° and smaller than 75° can disperse the force applied to the mesh-like high frequency electrode in a circular manner. Thus, the load can be supported by a wide area in the surface of the dielectric material layer.

Next, Example 1 was subjected to a thermal cycle test in which the thermal cycle test was repeated 100 times at a temperature from a room temperature to 500 degrees to measure the strength after the test. The result showed no deterioration in the strength. A conventional product shows a deterioration in the strength of 10 %. Specifically, a highly-reliable heater that had not only an absolute value but also was strong to a repeated stress cycle could be manufactured.

While preferred embodiments of the present invention have been described using specific terms, such description is for illustrative purposes, and it is to be understood that changes and variations may be made without departing from the spirit or scope of the claims.

What is claimed is:

1. A heating device comprising:
   a ceramic base having a heating surface for heating an object and an opposed surface, wherein a hole is formed in said opposed surface and extends toward said heating surface; and
   a mesh electrode embedded in said ceramic base and extending substantially parallel to said heating surface, wherein a portion of said mesh electrode proximate said hole has a trapezoidal concave shape extending away from said heating surface.

2. The heating device according to claim 1, wherein a distance between a part other than the trapezoidal concave portion of the mesh electrode and the heating surface is 1.2 mm or less.

3. The heating device according to claim 1, wherein the trapezoidal concave portion has a bottom face having a diameter of 3 mm- 5 mm, a depth of 1 mm- 3 mm, a maximum diameter of 7 mm or less, and a side wall having an inclination angle larger than 30° and smaller than 75°.

4. A heating device comprising:

a ceramic base having a heating surface for heating an object and an opposed surface, wherein a hole is formed in said opposed surface and extends toward said heating surface; and an electrode embedded in said ceramic base, said electrode having a first portion that extends substantially parallel to said heating surface at a first distance from said heating surface, and a second portion proximate said hole that extends substantially parallel to said heating surface at a second distance from said heating surface, wherein said second distance is greater than said first distance.

5. The heating device according to claim 4, wherein said first distance is 1.2 mm or less.

6. The heating device according to claim 4, wherein said second portion of said electrode has a trapezoidal concave shape with a bottom face having a diameter of 3 mm- 5 mm, a depth of 1 mm- 3 mm, a maximum diameter of 7 mm or less, and a side wall having an inclination angle larger than 30° and smaller than 75°.

7. A heating device comprising:

a ceramic base having a heating surface for heating an object and an opposed surface, wherein a hole is formed in said opposed surface and extends toward said heating surface;

an electrode embedded in said ceramic base and extending substantially parallel to said heating surface, wherein a portion of said mesh electrode proximate said hole has a trapezoidal concave shape extending away from said heating surface;

a stress relaxation member bonded to a surface of said ceramic base within said hole via a joining layer; and a power supply member joined to said stress relaxation member.

8. The heating device according to claim 7, wherein the trapezoidal concave portion has a bottom face having a diameter of 3 mm- 5 mm, a depth of 1 mm- 3 mm, a maximum diameter of 7 mm or less, and a side wall having an inclination angle larger than 30° and smaller than 75°.

* * * * *